US010367529B2

(12) United States Patent
Brueggen et al.

(10) Patent No.: US 10,367,529 B2
(45) Date of Patent: Jul. 30, 2019

(54) LIST DECODE CIRCUITS

(71) Applicant: Hewlett Packard Enterprise Development LP, Houston, TX (US)

(72) Inventors: Chris Michael Brueggen, Allen, TX (US); Ron M. Roth, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/417,431

(22) Filed: Jan. 27, 2017

(65) Prior Publication Data

US 2018/0219560 A1 Aug. 2, 2018

(51) Int. Cl.
*H03M 13/15* (2006.01)
*H03M 13/00* (2006.01)

(52) U.S. Cl.
CPC ....... *H03M 13/153* (2013.01); *H03M 13/158* (2013.01); *H03M 13/1515* (2013.01); *H03M 13/1565* (2013.01); *H03M 13/6502* (2013.01)

(58) Field of Classification Search
CPC ......... H03M 13/1545; H03M 13/1525; H03M 13/153; H03M 13/6561
See application file for complete search history.

(56) References Cited

U.S. PATENT DOCUMENTS 5,615,220 A * 3/1997 Pharris .................... G06F 7/726
714/785
6,209,115 B1 * 3/2001 Truong ............. H03M 13/1515
714/784
6,637,002 B1 * 10/2003 Weng ................ H03M 13/1545
708/507

(Continued)

FOREIGN PATENT DOCUMENTS

KR 20040050536 6/2004

OTHER PUBLICATIONS

R. Kotter, "A fast parallel implementation of a Berlekamp-Massey algorithm for algebraic-geometric codes," in IEEE Transactions on Information Theory, vol. 44, No. 4, pp. 1353-1368, Jul. 1998.*

(Continued)

*Primary Examiner* — Steve N Nguyen
(74) *Attorney, Agent, or Firm* — Hewlett Packard Enterprise Patent Department

(57) ABSTRACT

Examples disclosed herein relate to very large-scale integration (VLSI) circuit implementations of list decode circuits. In accordance with some examples disclosed herein, a device may include a first and second polynomial evaluation circuit, a field division circuit, a discrepancy filter, and an enhanced error locator polynomial (ELP) circuit. The first and second polynomial evaluation circuits may respectively evaluate a first and second polynomial output from a Berlekamp-Massey algorithm over a plurality of values in a finite field. The field division circuit may divide the outputs from the evaluations to generate a plurality of speculative discrepancy values for an additional iteration of the Berlekamp-Massey algorithm. The discrepancy filter circuit may filter the speculative discrepancy values down to a list of potentially valid discrepancy values that may be used by the enhanced ELP circuit to generate an enhanced ELP.

19 Claims, 7 Drawing Sheets

(56) References Cited

U.S. PATENT DOCUMENTS

| | | | | |
|---|---|---|---|---|
| 7,444,582 | B1* | 10/2008 | Au | H03M 13/1515 714/780 |
| 7,454,690 | B1* | 11/2008 | Au | H03M 13/1515 714/759 |
| 7,793,195 | B1* | 9/2010 | Wu | H03M 13/1515 714/781 |
| 8,413,023 | B2* | 4/2013 | Ashe | G11B 20/1833 714/781 |
| 8,468,431 | B2* | 6/2013 | Steiner | H03M 13/09 714/780 |
| 8,635,513 | B1 | 1/2014 | Au et al. | |
| 9,166,623 | B1* | 10/2015 | Bates | H03M 13/1515 |
| 2003/0101406 | A1* | 5/2003 | Song | H03M 13/00 714/774 |
| 2004/0177312 | A1* | 9/2004 | Xin | H03M 13/15 714/782 |
| 2008/0068217 | A1* | 3/2008 | Van Wyk | G01D 4/004 340/870.11 |
| 2008/0168336 | A1* | 7/2008 | Shen | H03M 13/1515 714/784 |
| 2014/0143633 | A1* | 5/2014 | Campbell | G06F 11/1048 714/764 |
| 2014/0181614 | A1* | 6/2014 | Kwok | H03M 13/1515 714/755 |
| 2016/0087654 | A1 | 3/2016 | Anderson | |
| 2017/0093433 | A1* | 3/2017 | Ilani | H03M 13/153 |
| 2017/0155407 | A1* | 6/2017 | Lin | H03M 13/152 |

OTHER PUBLICATIONS

Gross, W.J. et al; A VLSI Architecture for Interpolation in Soft-Decision List Decoding of Reed-Solomon Codes; http://citeseerx.ist.psu.edu/viewdoc/download;jsessionid=C4E07884D0F1A24AFF82F3ADF1F907C1?doi=10.1.1.19.5310&rep=rep1&type=pdf; 2002; 6 pages.

Liu, K.Y.; A VLSI Reed-Solomon Decoder Architecture for Concatenate-Coded Space and Spread Spectrum Communications; http://ieeexploreieee.org/document/4794780/; Oct. 31-Nov. 2, 1983; 5 pages.

Yung-Kuei Lu et al; Low-complexity Architecture for Chase Soft-decision Reed-Solomon Decoding; Department of Electrical Engineering National Cheng-Kung University; © 2014 IEEE; 4 pages.

Y. Wu, "New list decoding algorithms for Reed-Solomon and BCH codes", IEEE Transactions on Information Theory, vol. 54, No. 8, August 2008, pp. 3611-3630.

O. Ore, On a special class of polynomials, Transactions of the American Mathematical Society, vol. 35 (1933), pp. 559-584.

Massey, James, "Pseudo-code description of Berlekamp-Massey Algorithm", Wikipedia, 1969, 4 pages.

Lidl et al., Finite Fields, Second Edition, Cambridge University Press, 1997, American Mathematical Society, vol. 36, No. 1, Jan. 1999, pp. 99-101.

Leonard et al., "Quartics over GF(2n)", Proceedings of the American Mathematical Society, vol. 36, No. 2, Dec. 1972, pp. 347-350.

Guruswami et al., "Improved decoding of Reed-Solomon and algebraic-geometry codes", IEEE Transactions on Information Theory, vol. 45 Issue 6, Sep. 1999, pp. 1757-1767.

Gabidulin et al., "Theory of codes with maximum rank distance", Probl. Inform. Transm., vol. 21, 1985, pp. 1-12.

Egorov et al., "A modifed Blahut algorithm for de-coding Reed-Solomon codes beyond half the minimum distance", IEEE Transactions on Communications, vol. 52, 2004, pp. 2052-2056.

Beelen et al., "On rational interpolation-based list-decoding and list-decoding binary Goppa codes", IEEE Trans. Inf. Theory, 59 (2013), 3269-3281.

* cited by examiner

LIST DECODE CIRCUITS

BACKGROUND

Reed-Solomon codes may be used to protect data in memory or storage, where the capability to correct and erase burst errors allows various kinds of device failures to be tolerated. In general, a Reed-Solomon code may allow for the correction of $\tau$ symbol errors, based on a code distance D (i.e., $\tau < D/2$).

Various error correction methods have been developed to allow for the correction of a larger number of symbol errors (i.e., $\tau \geq D/2$) for some percentage of error patterns. These error correction methods may be referred to as list decoding methods, because they produce a list of potential error patterns (or valid code words). Given the list of potential error patterns, it is often possible to select the most likely error pattern (or valid code word) based on higher level information.

BRIEF DESCRIPTION OF THE DRAWINGS

The following detailed description references the drawings, wherein.

DETAILED DESCRIPTION

Figure 1:
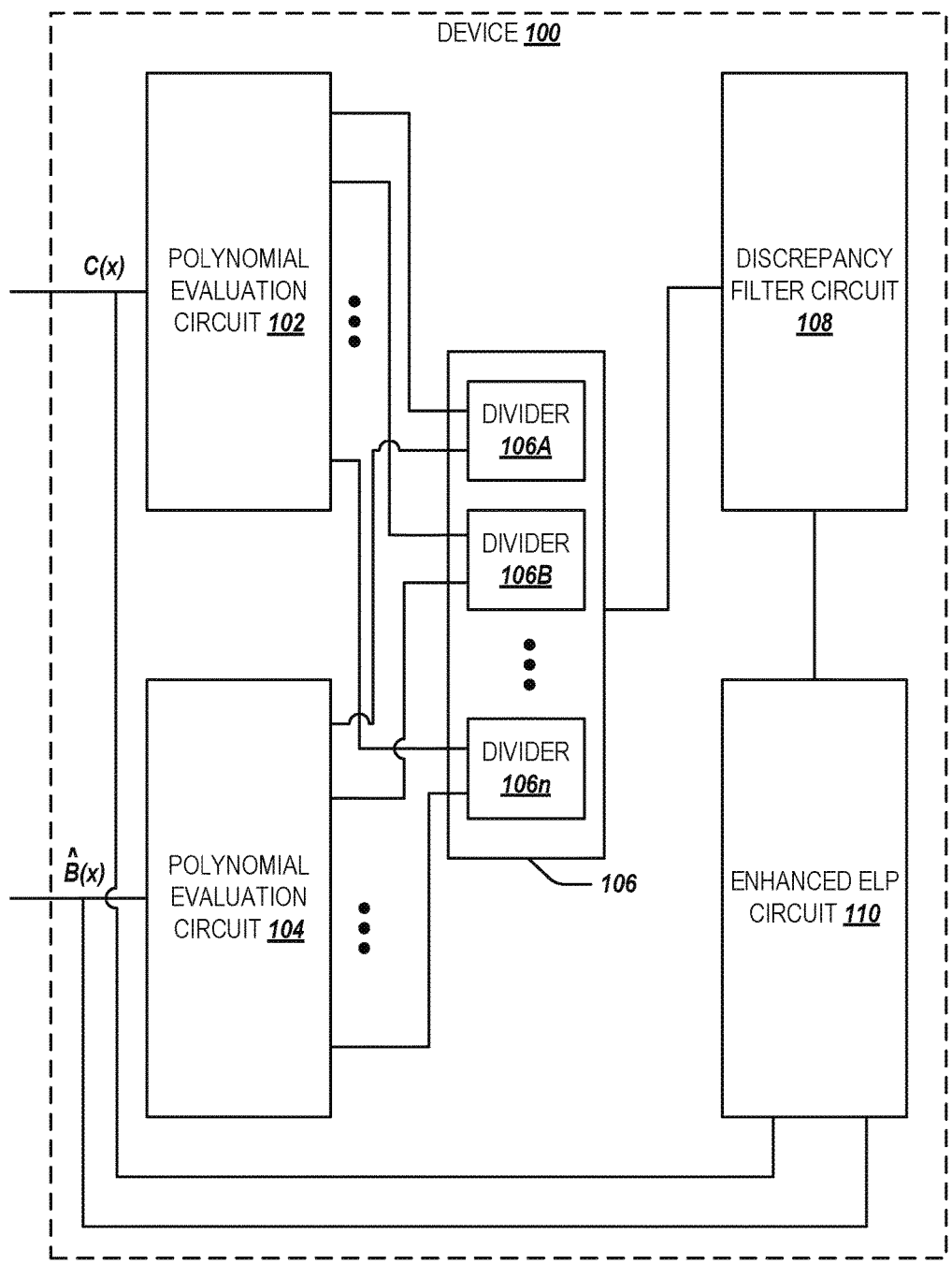
FIG. 1 is a block diagram of an example device for list decoding.

Examples disclosed herein provide very large scale integration (VLSI) circuit implementations of a list decode method for Reed Solomon codes of even distance, which allow for the correction of $\tau=D/2$ symbol errors. The disclosed list decoder circuit implementations are parallelized and pipelined, making them suitable for use in a high throughput error correction code (ECC) decoders.

In accordance with some examples disclosed herein, a device, such as an application specific integrated circuit (ASIC), may include a first polynomial evaluation circuit, a second polynomial evaluation circuit, a field division circuit, a discrepancy filter circuit, and an enhanced error locator polynomial (ELP) circuit. The first polynomial evaluation circuit may evaluate a first polynomial output, which may be an ELP, from a Berlekamp-Massey algorithm for a plurality of values in a finite field in parallel. Each of the plurality of values in the finite field may correspond to a possible error location in an error correction codeword. The second polynomial evaluation circuit may evaluate a second polynomial output from the Berlekamp-Massey algorithm for the plurality of values in the finite field in parallel. The field division circuit may generate a plurality of speculative discrepancy values for an additional iteration of the Berlekamp-Massey algorithm based on the evaluations of the first and second polynomial outputs. The discrepancy filter circuit may identify, as potentially valid discrepancy values, speculative discrepancy values that occur in the generated plurality of speculative discrepancy values a quantity of times equal to a quantity of correctable errors in the error correction codeword. The enhanced ELP circuit may generate one or more enhanced ELPs using the potentially valid discrepancy values and the first and second polynomial outputs similar to the computations that would occur in an additional iteration of the Berlekamp-Massey algorithm.

Reference is now made to the accompanying drawings. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the present disclosure does not limit the disclosed examples. Instead, the proper scope of the disclosed examples may be defined by the appended claims.

The terminology used herein is for the purpose of describing particular examples only and is not intended to be limiting. As used herein, the singular forms "a," "an," and "the" are intended to include the plural forms as well, unless the context clearly indicates otherwise. The term "plurality," as used herein, is defined as two or more than two. The term "another," as used herein, is defined as at least a second or more. The term "coupled," as used herein, is defined as connected, whether directly without any intervening elements or indirectly with at least one intervening elements, unless otherwise indicated. Two elements can be coupled mechanically, electrically, or communicatively linked through a communication channel, pathway, network, or system. The term "and/or" as used herein refers to and encompasses any and all possible combinations of the associated listed items. It will also be understood that, although the terms first, second, third, etc. may be used herein to describe various elements, these elements should not be limited by these terms, as these terms are only used to distinguish one element from another unless stated otherwise or the context indicates otherwise. As used herein, the term "includes" means includes but not limited to, the term "including" means including but not limited to. The term "based on" means based at least in part on.

FIG. 1 is a block diagram of an example device 100 for implementing various list decoding methods. As shown in FIG. 1, device 100 may include various circuits and circuit components, such as a polynomial evaluation circuit (e.g., polynomial evaluation circuit 102 and polynomial evaluation circuit 104), a field division circuit 106, a discrepancy filter circuit 108, and an enhanced ELP circuit 110. Other arrangements and numbers of components may be utilized without departing from the examples of the present disclosure.

Device 100 may be, for example, an ASIC device, a system-on-chip (SoC), or a field-programmable gate array (FPGA). Polynomial evaluation circuit 102, polynomial evaluation circuit 104, field division circuit 106, discrepancy filter circuit 108, and enhanced ELP circuit 110 may be electronic and/or digital logic circuits implemented by device 100. These circuits and circuit components may be defined in a hardware description language (HDL) such as VHDL or Verilog.

In some implementations, device 100 may be a list decode device that is a part of a larger memory controller system. Device 100 may generally perform error detection and correction for memory devices associated with the memory controller. The memory devices may be volatile (e.g., dynamic random-access memory (RAM) (DRAM), synchronous DRAM (SDRAM), or static RAM (SRAM)) and/or non-volatile memory (e.g., memristor, resistive RAM (RRAM), or phase change RAM (PCRAM)) devices included on one or a plurality of dual in-line memory modules (DIMMs). The DIMMs may be included in a computing system having a processor (or processors) such as a server, personal computing device, or mobile computing device.

The memory controller system may read information from a group of memory devices included in the computing system. Information may be read out of the memory devices one codeword at a time. For a read operation, each memory device in the group may contribute a group of symbols to the codeword. For example, a group of ten memory devices may each contribute eight symbols to an 80 symbol codeword. Each symbol may include, for example, eight bits. The codewords may be error-correction codewords, such as Reed-Solomon codewords, that include a plurality of check symbols for detecting and correcting errors in the codewords. The error-correction code distance D of the codeword may be equal to one plus the quantity of check symbols in the codeword.

Device 100 may receive the codewords and perform error detection and correction for the received codewords. For each received codeword, device 100 may calculate an expected error-correction codeword for the received codeword and compare the expected codeword to the actual received codeword. If there are differences between the expected and actual error-correction codeswords, errors are likely be present in the codeword. The differences between the expected and actual codewords may be collectively referred to as the syndrome of the codeword. The syndrome may be expressed as a polynomial S(x) (1):

$$S(x)=S_0+S_1x+\ldots+S_{D-2}x^{D-2} \quad (1)$$

The syndrome of the codeword may be used to find locations of the errors in the codeword. To determine the error locations in the codeword, a Berlekamp-Massey algorithm (BMA) circuit (not shown) may compute an ELP C(x) (2) for L errors:

$$C(x)=1+C_1x+C_2x^2+\ldots+C_{L-1}x^{L-1}+C_Lx^L \quad (2)$$

The Berlekamp-Massey algorithm may determine a minimal degree of L and C(x) which results in all syndromes $S_n+C_1S_{n-1}+\ldots+C_LS_{n-L}$ being equal to 0, where $L\leq n\leq N-1$, N being the total number of syndrome coefficients which may be equal to D−1.

In the Berlekamp-Massey algorithm, the BMA circuit may initialize L to 1 and iterate over each syndrome coefficient. Each iteration k may generate a discrepancy δ (3):

$$\delta=S_k+C_1S_{k-1}+\ldots+C_LS_{k-L} \quad (3)$$

If the discrepancy δ for iteration k is not zero, the Berlekamp-Massey algorithm may adjust C(x) according to (4) so that a recalculation of would be zero:

$$C(x)=C(x)-\left(\frac{\delta}{b}\right)x^m B(x) \quad (4)$$

where b is a copy of the last discrepancy δ since L was updated or initialized to 1, m is the number of iterations since L, B(x), and b were updated or initialized to 1, and B(x) is a copy of the last C(x) since L was updated or initialized to 1. The Berlekamp-Massey algorithm may continue to adjust the polynomial C(x) in subsequent iterations until the resulting discrepancy δ becomes zero.

The polynomial C(x) resulting from the final iteration of the Berlekamp-Massey algorithm may be an ELP that may be used to find the locations of L errors in the codeword, where the locations correspond to the inverse roots of the ELP. The final ELP C(x) may be used to correct up to quantity τ errors, where τ<D/2, For example, where the code distance D of the codeword is 16, the BMA circuit may run 15 iterations of the Berlekamp-Massey algorithm to calculate a final ELP C(x) capable of correcting up to seven symbol errors in the codeword.

In order to increase the error correction capability of the memory controller when the code distance D is even, device 100 may generate an additional iteration of the Berlekamp-Massey algorithm using the final ELP C(x) that was generated from the last iteration of the Berlekamp-Massey algorithm by the BMA circuit and a polynomial $\hat{B}(x)$ such that the total quantity of iterations is an even number. Polynomial $\hat{B}(x)$ may be a copy of an ELP C(x) from the last iteration of the Berlekamp-Massey algorithm, referred to as B(x), shifted to the left by value m.

The discrepancy δ resulting from the additional iteration of the Berlekamp-Massey algorithm may be used to enhance the ELP such that an additional symbol error in the codeword may be corrected. Thus, in the example above, device 100 may generate a $16^{th}$ iteration of the Berlekamp-Massey algorithm to generate an enhanced ELP capable of correcting up to eight symbol errors (i.e., τ≤16/2). Accordingly, the examples disclosed herein are capable of accommodating high bit-error rates without changing the encoding of data in the memory devices or increasing memory capability overhead by adding additional symbols to the error-correction code. Moreover, the examples disclosed herein support high memory-read bandwidth and low latency even when read errors occur at a high frequency.

One of the challenges for generating an enhanced ELP is that there may be a plurality of possible discrepancies resulting from an additional iteration of the Berlekamp-Massey algorithm. Accordingly, in order to select the correct or best discrepancy for the enhanced ELP, device 100 may narrow the list of possible discrepancy values by generating a plurality of speculative discrepancy values for the additional iteration of the Berlekamp-Massey algorithm and filtering out invalid discrepancy values.

Polynomial evaluation circuit 102, polynomial evaluation circuit 104, and field division circuit 106 may generate the plurality of speculative discrepancy values δ based on algorithm (5):

$$\delta=\left.\frac{C(x)}{\hat{B}(x)}\right|x=\alpha_j^{-1} \quad (5)$$

Polynomial evaluation circuit 102 may evaluate C(x) (i.e., the last ELP output from the Berlekamp-Massey algorithm received from the BMA circuit) for a plurality of values in finite field F. Similarly, polynomial evaluation circuit 104 may evaluate $\hat{B}(x)$ (i.e., the final $\hat{B}(x)$ output from the Berlekamp-Massey algorithm received from the BMA circuit) for the plurality of values in finite field F. The plurality of j values in finite field F may correspond to a possible error location in the codeword. For example, where a shortened code is used, the codeword may include 80 symbol locations. Accordingly, in the example, polynomial evaluation circuits 102 and 104 may evaluate their respective polynomials over the 80 symbol locations (e.g., $a^0, a^{-1}, \ldots, a^{-79}$) in finite field F.

The result of the evaluation of polynomial C(x) by polynomial evaluation circuit 102 and the result of the evaluation of polynomial $\hat{B}(x)$ by polynomial evaluation circuit 104 for the plurality of values in F may be input into field division circuit 106. Field division circuit 106 may be a Galois field division function that generates a speculative discrepancy value for the plurality of values in F by dividing the polynomial C(x) evaluation output from polynomial evaluation circuit 102 by the polynomial $\hat{B}(x)$ evaluation output from polynomial evaluation circuit 104 for the plurality of values in F.

Polynomial evaluation circuit 102, polynomial evaluation circuit 104, and field division circuit 106 may each be parallelized to greatly reduce the number of clock cycles it takes to generate the plurality of speculative discrepancy values for the additional iteration of the Berlekamp-Massey algorithm. Moreover, to further reduce the number of clock cycles, and to improve throughput of device 100, polynomial evaluation circuit 102 and polynomial evaluation circuit 104 may be collectively parallelized. For example, polynomial evaluation circuit 102 may evaluate polynomial C(x) for the plurality of values in finite field F in parallel. Polynomial evaluation circuit 104 may evaluate polynomial $\hat{B}(x)$ for the plurality of values in F in parallel. Collectively, the evaluations performed by polynomial evaluation circuit 102 and polynomial evaluation circuit 104 may be performed in parallel. Polynomial evaluation circuit 102 and polynomial evaluation circuit 104 may each comprise parity logic, such as a plurality of exclusive OR (XOR) gates, and the evaluations of polynomial C(x) and polynomial $\hat{B}(x)$ over the plurality of values in finite field F may be represented as a multiplication of a binary row vector by a binary matrix.

Similar to the evaluations performed by polynomial evaluation circuit 102 and polynomial evaluation circuit 104, field division circuit 106 may perform the division of the outputs from the evaluation of polynomial C(x) from polynomial evaluation circuit 102 by the outputs from the evaluation of polynomial $\hat{B}(x)$ from polynomial evaluation circuit 104 for the plurality of values in F in parallel. For example, and as shown in FIG. 1, field division circuit 106 may comprise a plurality of divider circuits 106A-106n. Each divider circuit among circuits 106A-106n may receive, in parallel, one entry from a vector of values resulting from the evaluation of polynomial C(x) (e.g., {$C(a^0), C(a^{-1}), C(a^{-2}), \ldots$}) and one entry from a vector of values resulting from the evaluation of polynomial $\hat{B}(x)$ (e.g., {$\hat{B}(a^0), \hat{B}(a^{-1}), \hat{B}(a^{-2}), \ldots$}) for the plurality of values in F and may divide the received value resulting from the evaluation of polynomial C(x) by the received value resulting from the evaluation of polynomial $\hat{B}(x)$ (i.e., $C(a^0)/\hat{B}(a^0), C(a^{-1})/\hat{B}(a^{-1}), C(a^{-2})/\hat{B}(a^{-2}), \ldots$)) to generate speculative discrepancy values in parallel.

The implementation of device 100 in hardware (e.g., ASIC, SoC, or FPGA) is particularly advantageous because it allows for efficient generation of the plurality of speculative discrepancy values compared to a software implementation. For example, parallelizing the evaluations of polynomial C(x) and polynomial $\hat{B}(x)$ and the divisions performed by field division circuit 106 in hardware allows for the computationally intensive process of the polynomial evaluations and the generation of the plurality of speculative discrepancy values to be completed in a single clock cycle (i.e., the same clock cycle) of the hardware of device 100 whereas a software implementation would take many (i.e., thousands) clock cycles.

The plurality of speculative discrepancy values generated by field division circuit 106 may be fed into discrepancy filter circuit 108, which may identify potentially valid discrepancy values among the plurality of speculative discrepancy values (i.e., discrepancy values that may produce a valid enhanced ELP). Discrepancy filter circuit 108 may identify potentially valid discrepancy values based on the frequency of occurrence of speculative discrepancy values in the plurality of speculative discrepancy values. For example, discrepancy filter circuit 108 may identify, as potentially valid discrepancy values, speculative discrepancy values that occur in the generated plurality of speculative discrepancy values a quantity of times equal to the quantity of correctable errors in the codeword when using the enhanced ELP (i.e., that occur $\tau = D/2$ times). In some implementations, where known symbol errors locations in the codeword (referred to as erasures) are provided to device 100, discrepancy filter circuit 108 may identify, as potentially valid discrepancy values, speculative discrepancy values that occur $\tau = (D-E)/2$ times, where E is the quantity of erasures in the codeword.

Discrepancy filter circuit 108 may provide the potentially valid discrepancy values to enhanced ELP circuit 110. Enhanced ELP circuit 110 may select a discrepancy value among the potentially valid discrepancy values in the additional iteration of the Berlekamp-Massey to generate the enhanced ELP for correcting an additional symbol error in the codeword. Enhanced ELP circuit 110 may generate the enhanced ELP using the selected discrepancy value and polynomial C(x) and polynomial $\hat{B}(x)$.

Figure 2:
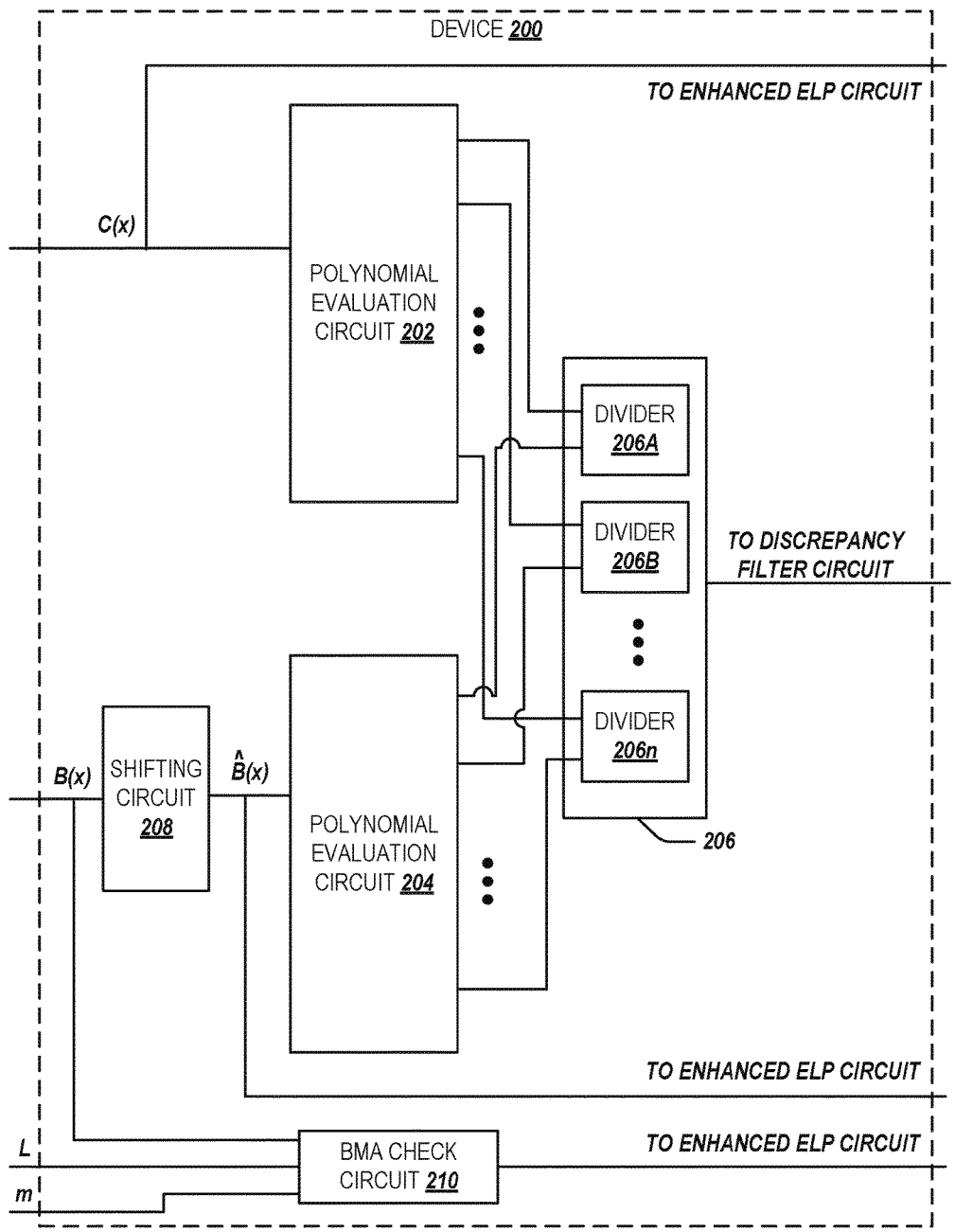
FIG. 2 is a block diagram of an example device for list decoding.

FIG. 2 is a block diagram of an example device 200 for implementing various list decoding methods. Device 200 may be similar to device 100 and may include circuits similar to device 100, such as a polynomial evaluation circuit (e.g., polynomial evaluation circuit 202 and polynomial evaluation circuit 204) and a field division circuit 206. Other similar circuits (e.g., discrepancy filter circuit and enhanced ELP circuit) are omitted for the sake of clarity. In addition, device 200 may include a shifting circuit 208 and a Berlekamp-Massey algorithm (BMA) check circuit 210. Other arrangements and numbers of components may be utilized without departing from the examples of the present disclosure.

As part of generating an additional iteration of the Berlekamp-Massey algorithm for enhanced error correction, polynomial C(x) from the last Berlekamp-Massey algorithm iteration may be provided to polynomial evaluation circuit 202. polynomial B(x) from the last Berlekamp-Massey algorithm iteration may be provided to shifting circuit 208. Shifting circuit 208 may shift polynomial B(x) left by one to three symbols based on value m to generate polynomial $\hat{B}(x)$. Polynomial $\hat{B}(x)$ may be provided to evaluation circuit 204, which may evaluate polynomial $\hat{B}(x)$ for a plurality of values in finite field F in parallel with the evaluation of polynomial C(x) by polynomial evaluation circuit 202 for the plurality of values in finite field F. Field division circuit 206 may divide each vector output from the evaluation of polynomial C(x) from polynomial evaluation circuit 202 by each corresponding vector output of the evaluation of polynomial $\hat{B}(x)$ from polynomial evaluation circuit 204 for the plurality of values in F in parallel (i.e., by dividing respective vector values of the evaluation of polynomial C(x) by vector values of the evaluation of polynomial $\hat{B}(x)$ using dividers 206A-206n) to generate a plurality of speculative discrepancy values for generating an enhanced ELP in an additional iteration of the Berlekamp-Massey algorithm.

In parallel with the above processing performed by polynomial evaluation circuit 202, polynomial evaluation circuit 204, and field division circuit 206, BMA check circuit 210 may receive polynomial B(x), value m, and the quantity of suspected error locations L in the codeword. BMA check circuit 210 may check the received polynomial B(x); value in, and the quantity of suspected error locations L and determine whether the enhanced ELP generated by the additional iteration of the Berlekamp-Massey algorithm or the final ELP produced from the last iteration of the Berlekamp-Massey algorithm should be used for correcting the errors in the codeword. For example, BMA check circuit 210 may provide a selection signal to the enhanced ELP circuit to select the final ELP produced from the last iteration of the Berlekamp-Massey algorithm in response to determining that L<(D−E)/2. As another example, BMA check circuit 210 may provide a selection signal to the enhanced ELP circuit to select the enhanced ELP in response to determining that L=(D−E)/2 and that value m is 1 and results in a polynomial B(x) with degree (D−E)/2. As a further example, BMA check circuit 210 may return an uncorrectable error notification due to the error pattern being uncorrectable in response to determining that L=(D−E)/2 and that value and the degree of polynomial B(x) being inconsistent with a (D−E)/2 symbol error.

In some implementations, instead of providing the selection signal directly to the enhanced ELP circuit, BMA check circuit 210 may store the selection signal in a register (not shown) so that enhanced ELP circuit may retrieve the selection signal from the register. Moreover, polynomial C(x) and polynomial B̂(x) may be stored in registers (not shown) such that enhanced ELP circuit may retrieve them from the registers.

Figure 3:
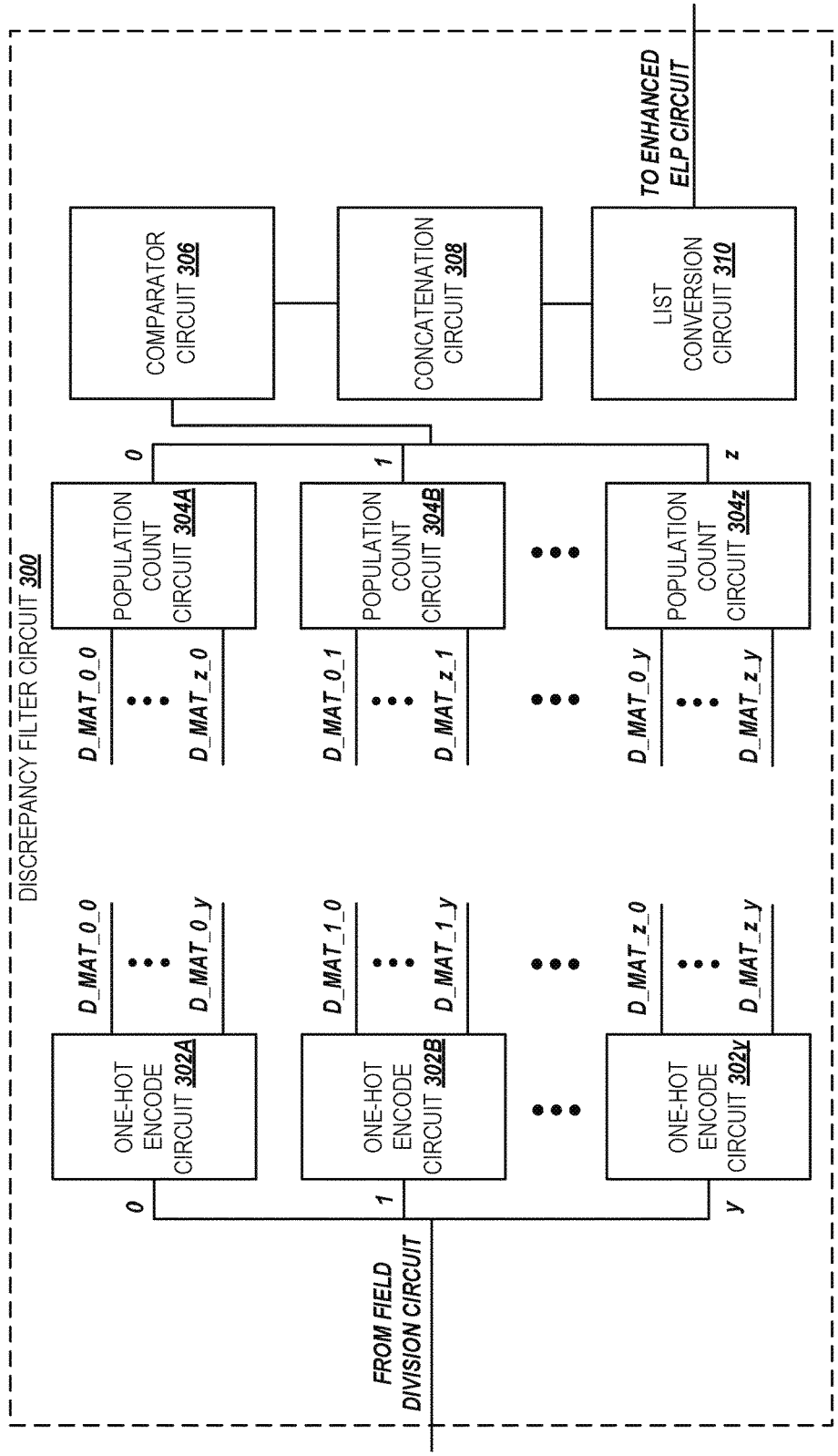
FIG. 3 is a block diagram of an example discrepancy filter circuit for list decoding.

FIG. 3 is a block diagram of an example discrepancy filter circuit 300 for implementing various list decoding methods. Discrepancy filter circuit 300 may be used to implement discrepancy filter circuit 108 of FIG. 1 and the associated functionalities described above or vice-versa. As shown in the example illustrated in FIG. 3, discrepancy filter circuit 300 may include a plurality of one-hot encode circuits 302A-302y, a plurality of population count circuits 304A-304z, a comparator circuit 306, a concatenation circuit 308, and a list conversion circuit 310. These circuits may be implemented similarly to discrepancy filter circuit 108 described above in reference to FIG. 1, generally. The number and arrangement of these components is an example only and provided for purposes of illustration. Other arrangements and numbers of components may be utilized without departing from the examples of the present disclosure.

As shown in FIG. 3, discrepancy filter circuit 300 may receive as plurality of speculative discrepancy values for an additional iteration of a Berlekamp-Massey algorithm from a field division circuit (e.g., field division circuit 106 of FIG. 1, field division circuit 206 of FIG. 2, etc.). Each discrepancy value in the plurality may be received in the form of an eight-bit explicit value. The received plurality of speculative discrepancy values may be fed into the plurality of one-hot encode circuits 302A-302y. Each one-hot encode circuit in the plurality may receive an eight-bit explicit discrepancy value from the plurality of speculative discrepancy values (e.g., one of eight-bit value 0 through eight-bit value y) and may perform a one-hot encode on the eight-bit value. The one-hot encode may include encoding the eight bits into a z-bit vector (e.g., 256-bit vector) having a single high bit value (i.e., 1 value) representing the combination of the eight bits in the value. Each unique combination of eight bits may be assigned a unique single-high-bit z-bit vector.

Discrepancy filter circuit 300 may view the z-bit vectors of eight-bit values 0 through y as a binary matrix, each z-bit vector being a row in the binary matrix from row 0 to row y. Population count circuits 304A-304z may each count the population of high-bit values (i.e., 1 values) in one of the columns 0 through z in the binary matrix. Population count circuits 304A-304z may be implemented as balanced adder trees, where the maximum adder width is just large enough to accommodate the maximum necessary population count value $\tau=(D-E)/2$. The count of high-bit values for each column is passed through comparator circuit 306, which determines whether each z-bit vector occurs in the binary matrix $\tau=(D-E)/2$ times (i.e., a quantity of times equal to the quantity of correctable errors when using the enhanced ELP). Comparator circuit 306 may output a high-bit value (i.e., a 1 value) for z-bit vectors that occur in the binary matrix $\tau$ times and a low-bit value (i.e., a 0 value) for z-bit vectors that occur in the binary matrix less than $\tau$ times.

The string of output values may be passed to concatenation circuit 308, which may generate a final z-bit value that represents a concatenation of z-bit vectors occurring in the binary matrix $\tau$ times. The final z-bit value may be passed to list conversion circuit 310. List conversion circuit 310 may include a plurality of linked population count circuits, a plurality of one-hot decoder circuits and a plurality of OR circuits that may convert the final z-bit value to a compact list of explicit eight-bit discrepancy values. The compact list of explicit eight-bit discrepancy values may be provided to an enhanced ELP circuit (e.g., enhanced ELP circuit 110 of FIG. 1) as a list of potentially valid discrepancy values capable of generating an enhanced ELP in an additional iteration of the Berlekamp-Massey algorithm.

Figure 4:
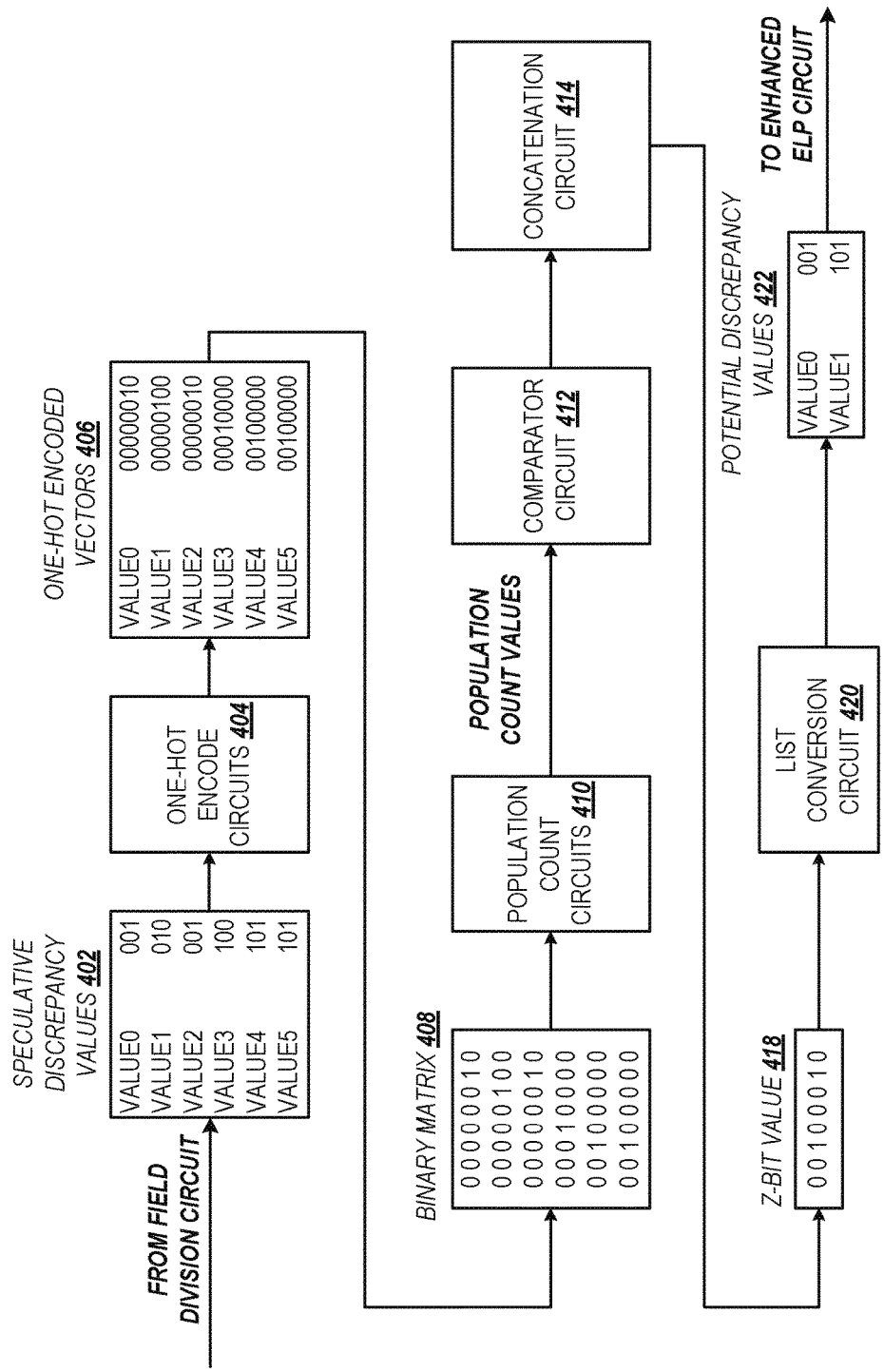
FIG. 4 is an illustration of an example flow for the identification of potentially valid discrepancy values.

FIG. 4 is an illustration of an example flow 400 for the identification of potentially valid discrepancy values from a list of speculative discrepancy values. Example flow 400 may be performed by a discrepancy filter circuit such as, for example, discrepancy filter circuit 108 of FIG. 1 and/or discrepancy filter circuit 300 of FIG. 3. As shown in FIG. 4, example flow 400 includes various quantities of speculative discrepancy values, one-hot encode values, potentially valid discrepancy values, and other values. These quantities are shown for the sake of simplification in the illustration of example flow 400 and are not meant to be limiting. Indeed, other quantities of these values may be used without departing from the examples of the present disclosure.

As shown in FIG. 4, a list of speculative discrepancy values 402, VALUE0 through VALUE5, may be received from a field division circuit (e.g., field division circuit 106 of FIG. 1 and field division circuit 206 of FIG. 2). Speculative discrepancy values 402 may be three-bit values in example flow 400. Each of speculative discrepancy values 402 may be passed to one of one-hot encode circuits 404 (e.g., one-hot encode circuits 302A-302y of FIG. 3). In example flow 400, one-hot encode circuits 404 may encode the three-bit values of VALUE0 through VALUE5 into eight-bit one-hot encoded vectors 406.

One-hot encoded vectors 406 may be viewed in a binary matrix 408 by population count circuits 410 (e.g., population count circuits 304A-304z of FIG. 3). Each of population count circuits 410 may count the number of 1's in a column of binary matrix 408 and pass the totals for each column to comparator circuit 412 (e.g., comparator circuit 306 of FIG. 3). Comparator circuit 412 may compare the total number of 1's in each column to $\tau=(D-E)/2$. In example flow 400, $\tau$ may be equal to 2, When the columns of binary matrix 408 are viewed from left to right in example flow 400, columns 3 and 7 each have two 1's and thus comparator circuit 412 sets a high value of 1 for those columns and a low value 0 for the remaining columns.

In example flow 400, the comparator values may be passed to concatenation circuit 414 (e.g., concatenation circuit 308 of FIG. 3). Concatenation circuit 414 may construct z-bit value 418, which in example flow 400 may be an eight-bit value, by concatenating the comparator values outputted from comparator circuit 412. Z-bit value 418 may be deconstructed by list conversion circuit 420 (e.g., list conversion circuit 310 of FIG. 3) into a compact list of three-bit potential discrepancy values 422. The compact list of potential discrepancy values 422 may be provided to an enhanced ELP circuit (e.g., enhanced ELP circuit 110 of FIG. 1) as a list of potentially valid discrepancy values capable of generating an enhanced ELP in an additional iteration of the Berlekamp-Massey algorithm.

Figure 5:
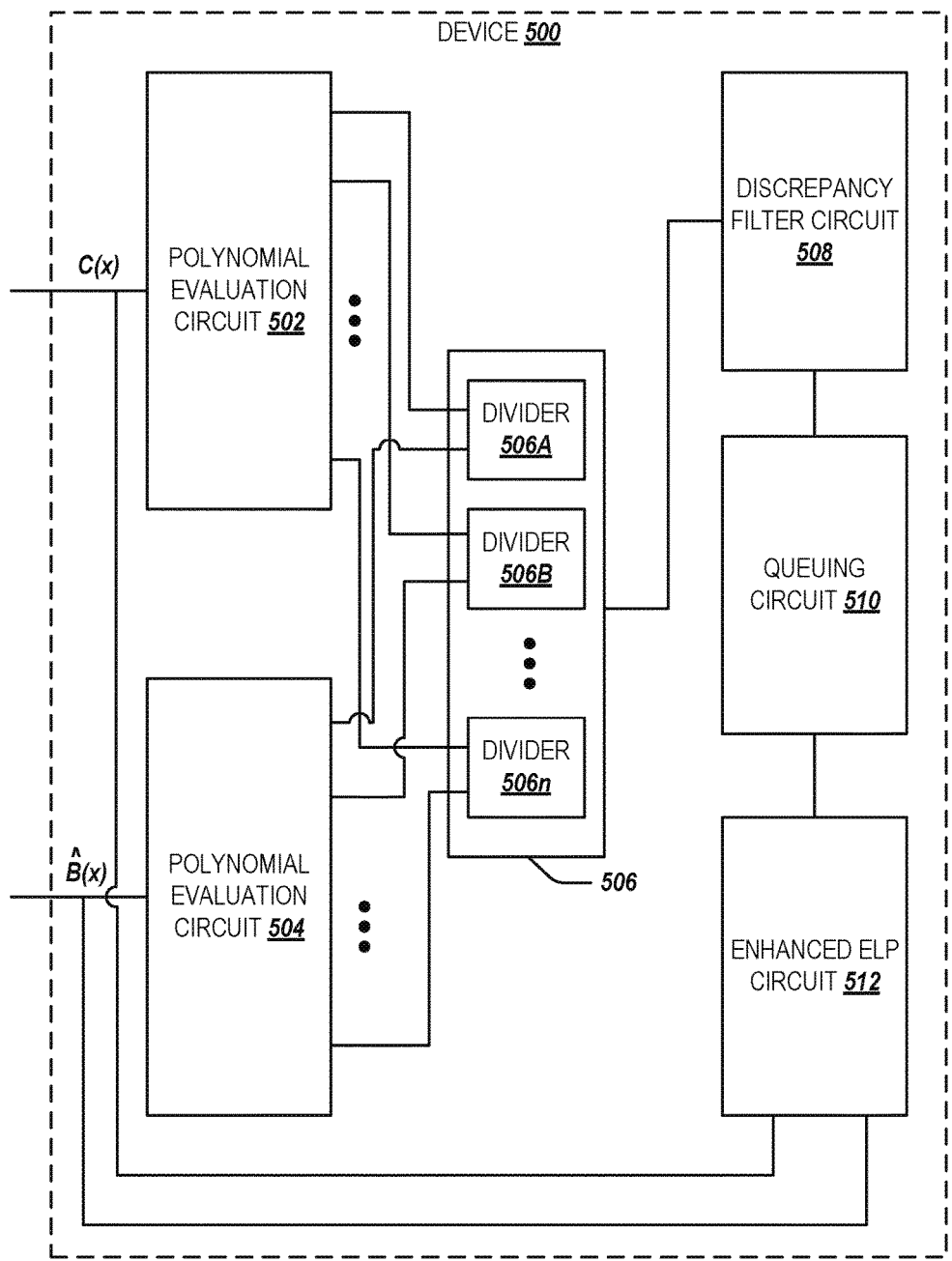
FIG. 5 is a block diagram of an example device for list decoding.

FIG. 5 is a block diagram of an example device 500 for implementing various list decoding methods. Device 500 may be similar to device 100 and may include circuits similar to device 100, such as a polynomial evaluation circuit (e.g., polynomial evaluation circuit 502 and polynomial evaluation circuit 504), a field division circuit 506 including a plurality of dividers 506A-506n, a discrepancy filter circuit 508, and an enhanced ELP circuit 512. These circuits may be implemented similarly and perform similar functions as similarly named components of device 100 in FIG. 1. In addition, device 500 may include a queuing circuit 510. Other arrangements and numbers of components may be utilized without departing from the examples of the present disclosure. For example, device 500 may additionally include a shifting circuit and BMA check circuit, such as shifting circuit 208 and BMA check circuit 210, both of FIG. 2.

Queuing circuit 510 may receive potentially valid discrepancy values identified by discrepancy filter circuit 508 for generating an enhanced ELP in an additional iteration of a Berlekamp-Massey algorithm for enhanced error correction. Queuing circuit 510 may place the received potentially valid discrepancy values in a queue and pass potentially valid discrepancy values to enhanced ELP circuit 512 from the queue based on the status of enhanced ELP circuit 512. For example, queuing circuit 510 may determine that enhanced ELP circuit 512 is idle (i.e., there is an open clock cycle because enhanced ELP circuit 512 is not processing a potentially valid discrepancy value) and, in response, may pass a potentially valid discrepancy value in the queue to enhanced ELP circuit 512 for processing. However, if queuing circuit 510 only receives one potentially valid discrepancy value from discrepancy filter circuit 508, queuing circuit may not queue the one potentially valid discrepancy value and instead pass it directly to enhanced ELP circuit 512.

Figure 6:
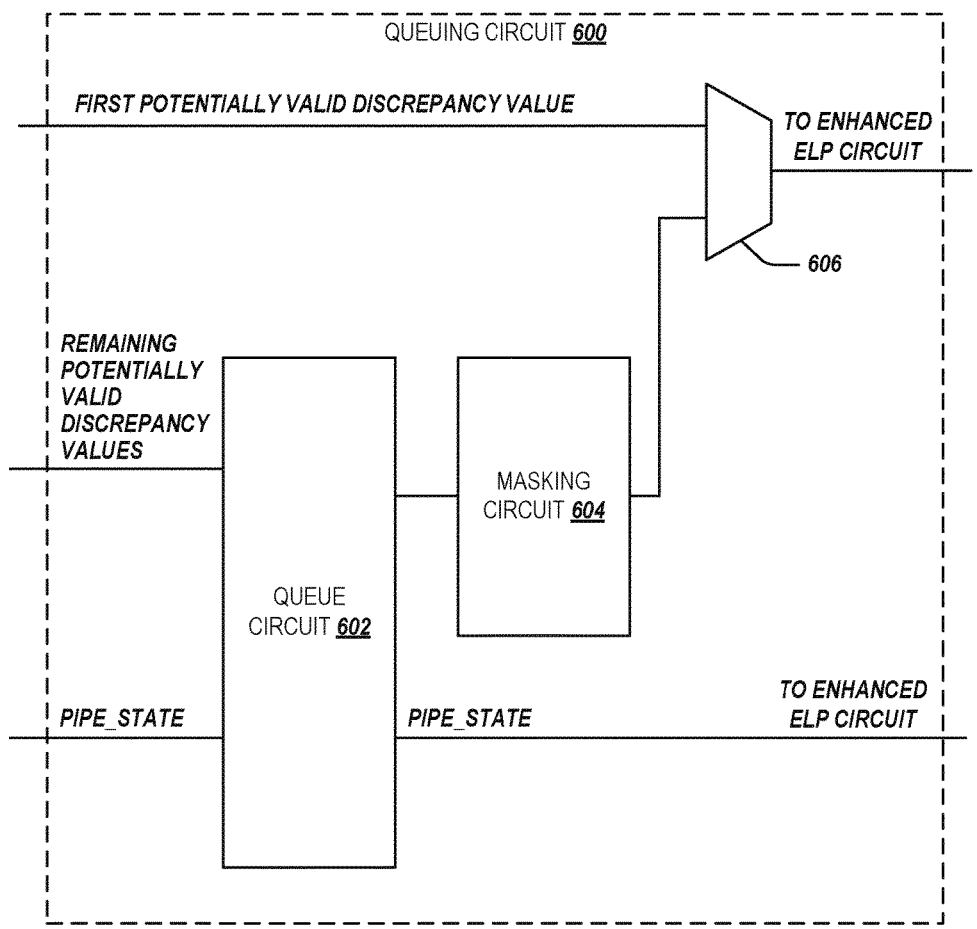
FIG. 6 is a block diagram of an example queuing circuit for list decoding.

FIG. 6 is a block diagram of an example queuing circuit 600 for implementing various list decoding methods. Queuing circuit 600 may be used to implement queuing circuit 510 of FIG. 5 and may be electronic and/or digital logic circuitry implemented by a device such as devices 100, 200, and 500 of FIGS. 1, 2, and 5, respectively. As shown in FIG. 6, queuing circuit 600 may include a queue circuit 602, a masking circuit 604, and a selection circuit 606 that may be implemented by electronic and/or digital logic circuitry. Other arrangements and numbers of components may be utilized without departing from the examples of the present disclosure.

Queuing circuit 600 may receive a plurality of potentially valid discrepancy values. Queuing circuit 600 may feed a first potentially valid discrepancy value directly into selection circuit 606 and may place the remaining potentially valid discrepancy values in a queue along with an assigned pipeline state (PIPE_STATE) using queue circuit 602. Queuing circuit 600 may pass the first potentially valid discrepancy value to an enhanced ELP circuit (e.g., enhanced ELP circuit 110 of FIG. 1, enhanced ELP circuit 512 of FIG. 5, etc.) first by selecting the first potentially valid discrepancy value input using selection circuit 606.

Remaining potentially valid discrepancy values may be queued in a single queue entry using queue circuit 602. When the single queue entry is presented at the output of queue circuit 602, and queuing circuit 600 determines that the enhanced ELP circuit is idle, the first remaining potentially valid discrepancy value in the queue may be injected into the enhanced ELP circuit's processing pipeline along with its assigned pipeline state by selecting the queue input on selection circuit 606. The head entry of the queue contains a list of one or more discrepancy values for the list decode of a given code word. Each potential discrepancy value in this entry is masked off by masking circuit 604 when it is injected into the pipeline, so that the queue entry is not dequeued until all the valid discrepancy values in its list have been injected into the processing pipeline of the enhanced ELP circuit.

Figure 7:
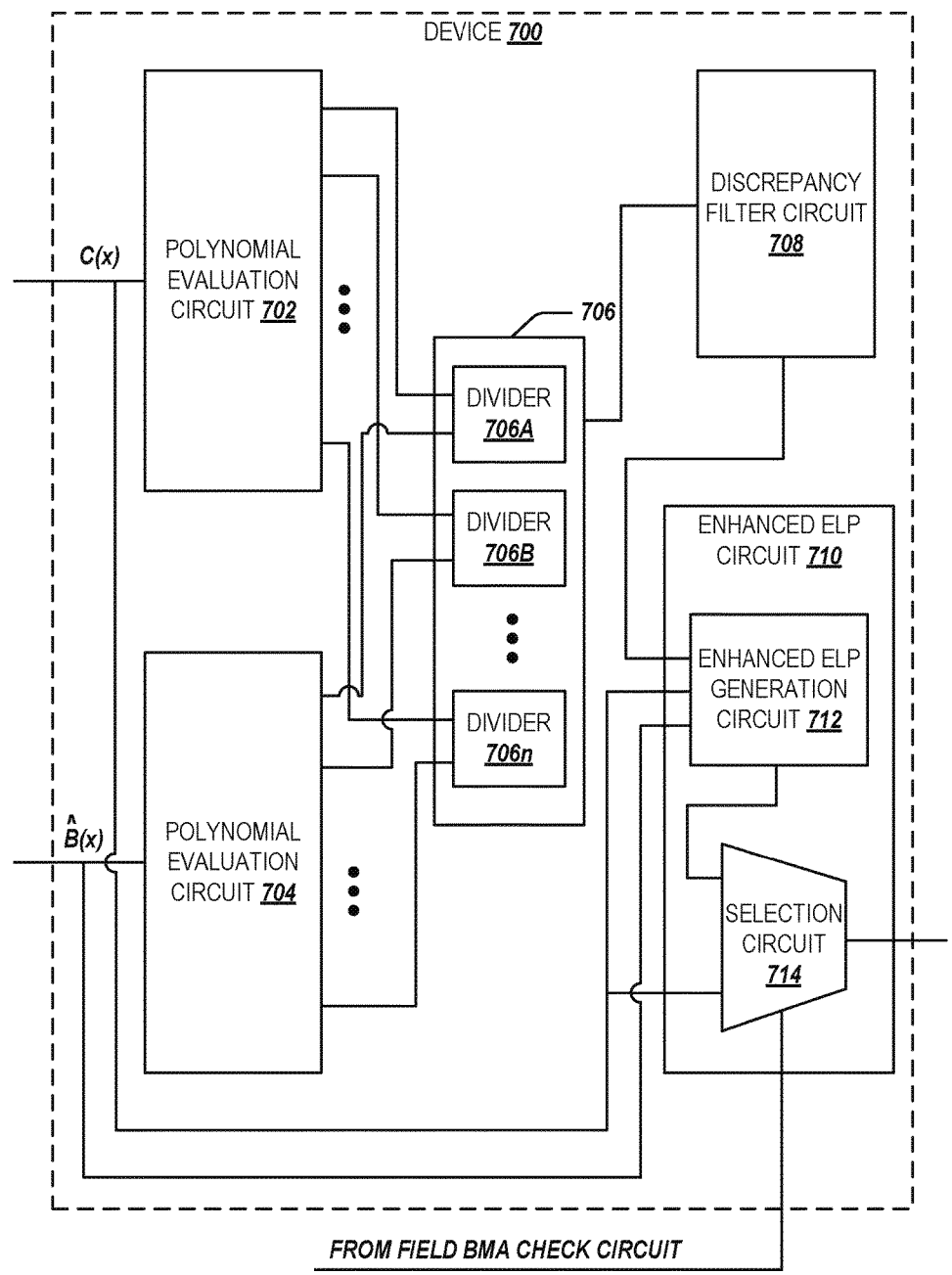
FIG. 7 is a block diagram of an example device for list decoding.

FIG. 7 is a block diagram of an example device 700 for implementing various list decoding methods. Device 700 may be similar to device 100 and may include circuits similar to device 100, such as a polynomial evaluation circuit (e.g., polynomial evaluation circuit 702 and polynomial evaluation circuit 704), a field division circuit 706 including a plurality of dividers 706A-706n, a discrepancy filter circuit 708, and an enhanced ELP circuit 710. These circuits may be implemented similarly and perform similar functions as similarly named components of device 100 in FIG. 1. In addition, enhanced ELP circuit 701 of device 700 may include an enhanced ELP generation circuit 712 and a selection circuit 714. These circuits may be implemented similarly to enhanced ELP circuit 710, generally. Other arrangements and numbers of components may be utilized without departing from the examples of the present disclosure. For example, device 700 may additionally include a shifting circuit and BMA check circuit, such as shifting circuit 208 and BMA check circuit 210, both of FIG. 2. As another example, discrepancy filter circuit 708 may be implemented by discrepancy filter circuit 300 of FIG. 3. As a further example, device 700 may additionally include a queueing circuit such as queueing circuit 600 of FIG. 6.

Enhanced ELP circuit 710 may receive an identified potentially valid discrepancy value from discrepancy filter circuit 708 for generating an enhanced ELP in an additional iteration of a Berlekamp-Massey algorithm for enhanced error correction. The potentially valid discrepancy value, along with the final polynomial C(x) that was generated from the last iteration of the Berlekamp-Massey algorithm and a polynomial (x), may be passed to enhanced ELP generation circuit 712. Enhanced ELP generation circuit 712 may process the additional iteration of the Berlekamp-Massey algorithm to generate the enhanced ELP.

Enhanced ELP generation circuit 712 may pass the generated enhanced ELP to selection circuit 714. The final ELP from the last iteration of the Berlekamp-Massey algorithm (i.e., polynomial C(x)) may also be provided as input to selection circuit 714. A selection signal from a BMA check circuit (e.g., BMA check circuit 210 of FIG. 2) may be received (or retrieved from a register) and may be used to select either the enhanced ELP or the final ELP from the last iteration of the Berlekamp-Massey algorithm for locating and correcting errors in a codeword.

The foregoing disclosure describes a number of example implementations for list decode circuits. For purposes of explanation, certain examples are described with reference to the components illustrated in FIGS. 1-7, The functionality of the illustrated components may overlap, however, and may be present in a fewer or greater number of elements and components. Further, all or part of the functionality of illustrated elements may co-exist or be distributed among several geographically dispersed locations.

Further, the sequence of operations described in connection with FIG. 4 is an example and is not intended to be limiting. Additional or fewer operations or combinations of operations may be used or may vary without departing from the scope of the disclosed examples. Furthermore, implementations consistent with the disclosed examples need not perform the sequence of operations in any particular order. Thus, the present disclosure merely sets forth possible examples of implementations, and many variations and modifications may be made to the described examples. All such modifications and variations are intended to be included within the scope of this disclosure and protected by the following claims.

The invention claimed is:

1. A device, comprising:
    a first polynomial evaluation circuit to evaluate a first polynomial output from a Berlekamp-Massey algorithm for a plurality of values in a finite field in parallel, each of the plurality of values in the finite field corresponding to a possible error location in an error correction codeword;
    a second polynomial evaluation circuit to evaluate a second polynomial output from the Berlekamp-Massey algorithm for the plurality of values in the finite field in parallel, the second polynomial evaluation circuit to evaluate the second polynomial output and the first polynomial evaluation circuit to evaluate the first polynomial output in parallel;
    a field division circuit to generate a plurality of speculative discrepancy values for an additional iteration of the Berlekamp-Massey algorithm by dividing outputs from the evaluation of the first polynomial output by outputs from the evaluation of the second polynomial output for each value in the finite field in parallel;
    a discrepancy filter circuit to identify, as potentially valid discrepancy values, speculative discrepancy values that occur in the generated plurality of speculative discrepancy values a quantity of times equal to a quantity of correctable errors in the error correction codeword; and
    an error locator polynomial (ELP) circuit to generate an ELP using the potentially valid discrepancy values and the first and second polynomial outputs.

2. The device of claim 1, comprising:
    a shifting circuit to shift symbols in the second polynomial output from the final iteration of the Berlekamp-Massey algorithm left by one to three symbols before being evaluated by the second polynomial evaluation circuit.

3. The device of claim 1, wherein the first polynomial evaluation circuit evaluates the first polynomial output, the second polynomial evaluation circuit evaluates the second polynomial output, and the field division circuit generates the speculative discrepancies in a same clock cycle of the device.

4. The device of claim 1, the discrepancy filter circuit comprising:
    a plurality of one-hot encoder circuits to one-hot encode each of the generated plurality of speculative discrepancy values;
    a plurality of population count circuits to:
        view each one-hot encoded speculative discrepancy value as a row in a binary matrix; and
        sum the number of 1's in each column of the binary matrix;
    a comparator circuit to compare the sum of the number of 1's in each column of the binary matrix to the quantity of correctable errors in the error correction codeword; and
    a concatenation circuit to generate a bit vector representation of the potentially valid discrepancy values based on the output of the comparator circuit.

5. The device of claim 4, the discrepancy filter circuit comprising:
    a list conversion circuit to convert the generated bit vector representation of the potentially valid discrepancy values to a plurality of explicit potentially valid discrepancy values.

6. The device of claim 5, wherein the list conversion circuit comprises a plurality of linked population count circuits, a plurality of one-hot decoder circuits and a plurality of OR circuits.

7. The device of claim 1, wherein the device is an application-specific integrated circuit (ASIC).

8. A device, comprising:
    first and second polynomial evaluation circuits to respectively evaluate first and second polynomial outputs from a Berlekamp-Massey algorithm for a plurality of values in a finite field in parallel, each of the plurality of values in the finite field corresponding to a possible error location in an error correction codeword;
    a field division circuit to generate a plurality of speculative discrepancy values for an additional iteration of the Berlekamp-Massey algorithm based on the evaluations of the first and second polynomial outputs;
    a discrepancy filter circuit to identify, as potentially valid discrepancy values, speculative discrepancy values that occur in the generated plurality of speculative discrepancy values a quantity of times equal to a quantity of correctable errors in the error correction codeword;
    a queuing circuit to:
        pass a first potentially valid discrepancy value to an error locator polynomial (ELP) circuit; and
        place remaining potentially valid discrepancy values in a queue with an assigned pipeline state; and
    the ELP circuit to generate an ELP using the potentially valid discrepancy values and the first and second polynomial outputs.

9. The device of claim 8, wherein the queuing circuit is to: pass the potentially valid discrepancy values in the queue to the ELP circuit in response to determining that the ELP circuit is idle.

10. The device of claim 9, the queuing circuit comprising:
    a masking circuit to mask the potentially valid discrepancy values in the queue as they are passed to the ELP circuit.

11. The device of claim 8, wherein the first polynomial output from the Berlekamp-Massey algorithm is an ELP from a previous iteration of the Berlekamp-Massey algorithm.

12. The device of claim 8, wherein the quantity of correctable errors in the error correction codeword is equal to (D−E)/2, D being a code distance of the error correction codeword and E being a quantity of symbol erasures in the error correction codeword.

13. The device of claim 8, wherein the field division circuit is a Galois field division circuit.

14. A device, comprising:
   first and second polynomial evaluation circuits to respectively evaluate first and second polynomial outputs from a Berlekamp-Massey algorithm for a plurality of values in a finite field in parallel, each of the plurality of values in the finite field corresponding to a possible error location in an error correction codeword;
   a field division circuit to generate a plurality of speculative discrepancy values for an additional iteration of the Berlekamp-Massey algorithm based on the evaluations of the first and second polynomial outputs;
   a discrepancy filter circuit to identify, as potentially valid discrepancy values, speculative discrepancy values that occur in the generated plurality of speculative discrepancy values a quantity of times equal to a quantity of correctable errors in the error correction codeword;
   an error locator polynomial (ELP) circuit, comprising:
      an ELP generation circuit to generate an ELP using the potentially valid discrepancy values and the first and second polynomial outputs in the additional iteration of the Berlekamp-Massey algorithm; and
      a selection circuit to select either the first polynomial evaluation output from the Berlekamp-Massey algorithm or the generated ELP for use in locating and correcting the errors in the error correction codeword.

15. The device of claim 14, wherein the quantity of correctable errors in the error correction codeword is equal to (D−E)/2, D being a code distance of the error correction codeword and E being a quantity of symbol erasures in the error correction codeword.

16. The device of claim 15, wherein the selection circuit is to:
   select the first polynomial evaluation output from the Berlekamp-Massey algorithm when a degree of the first polynomial output is less than (D−E)/2.

17. The device of claim 15, wherein the selection circuit is to:
   select the ELP when a degree of the first polynomial output and a degree of the second polynomial output are equal to (D−E)/2.

18. The device of claim 15, wherein the selection circuit is to:
   return an uncorrectable error notification when a degree of the first polynomial output is equal to (D−E)/2 and a degree of the second polynomial output is not equal to (D−E)/2.

19. The device of claim 14, comprising:
   a shifting circuit to shift symbols in the second polynomial output from the final iteration of the Berlekamp-Massey algorithm left by one to three symbols before being evaluated by the second polynomial evaluation circuit.

* * * * *